United States Patent
Wang

(10) Patent No.: US 7,615,412 B2
(45) Date of Patent: Nov. 10, 2009

(54) SYSTEM IN PACKAGE (SIP) INTEGRATED CIRCUIT AND PACKAGING METHOD THEREOF

(75) Inventor: Hsin-Shih Wang, Fremont, CA (US)

(73) Assignee: Faraday Technology Corp., Hsin-Chu (TW)

( * ) Notice: Subject to any disclaimer, the term of this patent is extended or adjusted under 35 U.S.C. 154(b) by 301 days.

(21) Appl. No.: 11/532,790

(22) Filed: Sep. 18, 2006

(65) Prior Publication Data

US 2008/0067674 A1    Mar. 20, 2008

(51) Int. Cl.
- H01L 21/44 (2006.01)
- H01L 21/48 (2006.01)
- H01L 21/50 (2006.01)

(52) U.S. Cl. .................. 438/110; 438/106; 438/127

(58) Field of Classification Search .......... 438/110, 438/125, 107, 106, 109, 124, 126, 127
See application file for complete search history.

(56) References Cited

U.S. PATENT DOCUMENTS

| | | | |
|---|---|---|---|
| 6,504,398 B1 | 1/2003 | Lien et al. | |
| 6,569,714 B2 * | 5/2003 | Becker | 438/128 |
| 6,768,186 B2 | 7/2004 | Letterman, Jr. et al. | |
| 7,006,370 B1 | 2/2006 | Ramesh et al. | |
| 7,342,310 B2 * | 3/2008 | Kelly et al. | 257/724 |

FOREIGN PATENT DOCUMENTS

| | | |
|---|---|---|
| TW | 521415 | 3/2003 |
| TW | I230992 | 4/2005 |
| TW | I243471 | 11/2005 |

OTHER PUBLICATIONS

Chinese Taiwan Examination Report of Taiwan Patent Application No. 095125797, dated Jun. 15, 2009.

* cited by examiner

*Primary Examiner*—Chuong A. Luu
(74) *Attorney, Agent, or Firm*—Winston Hsu

(57) ABSTRACT

The present invention discloses a system in package (SIP) integrated circuit and a packaging method thereof. The SIP integrated circuit includes one or more first block dices produced by a first process and one or more second block dices produced by a second process. The first block dices are electrically connected to the second block dices. The first block dices and the second block dices are packaged into a system.

10 Claims, 2 Drawing Sheets

SYSTEM IN PACKAGE (SIP) INTEGRATED CIRCUIT AND PACKAGING METHOD THEREOF

BACKGROUND OF THE INVENTION

1. Field of the Invention

The present invention relates to an integrated circuit and a packaging method thereof. More particularly, the present invention relates to a system in package (SIP) integrated circuit and a packaging method thereof.

2. Description of Related Art

Currently, integrated circuits have been developing towards executing more functions in circuits of smaller area. In the design of system on a chip (SOC), an analog circuit, a memory, an input/output unit, and even an IR circuit must be arranged on one chip, thus significantly increase the complexity of the circuit and reduces the yield of chips.

In the design of SOC, considering that the part of the analog circuit cannot be easily achieved by a process of extremely small process device size (e.g., under 90 nm), the process of chips may be limited by the part of the analog circuit. Furthermore, in the same process, the yield of the analog circuit is also lower than that of the digital circuit. Although in a chip, the disadvantage of lower yield of the analog circuit has been gradually overcome and the size of analog device has been gradually reduced due to the progress of science and technology, the development of the analog circuit is still left far behind the development of the digital circuit which can be made to have an extremely small process device size. Therefore, it is necessary to provide a method to solve the difference in process device sizes of the analog circuit and the digital circuit. Also, in SOC, when the design is altered, the entire chip must roll off the production line again and each layer of mask must be fabricated again, thus spending a lot of time and cost in improving the circuit or researching and developing a new circuit.

Conventionally, in order to solve the above problems, a field programmable gate array (FPGA) is applied to process the digital circuit, and certain devices (e.g., analog circuits, memories) are combined with the FPGA region, thereby being packaged into a system, which requires a larger cost and occupies a larger space.

SUMMARY OF THE INVENTION

An objective of the present invention is to provide an SIP integrated circuit, thereby reducing the amount of masks and the non-recurring engineering (NRE) cost, raising the yield, reducing the production time, and enhancing the flexibility of circuit design.

Another object of the present invention is to provide a method of packaging an SIP integrated circuit, thereby raising the yield, reducing the amount of masks and the NRE cost, reducing the production time, and enhancing the flexibility of circuit design.

The present invention provides an SIP integrated circuit, which comprises one or more first block dices produced by a first process and one or more second block dices produced by a second process, wherein at least one of the first process and the second process comprises the usage of a metal programmable cell array (MPCA) technique or known as the structured ASIC technique, the first block dices are electrically connected to the second block dices, such that both the first block dices and the second block dices are packaged into a system.

According to a preferred embodiment of the present invention, in the SIP integrated circuit, the process device size of the first block dices is smaller than that of the second block dices.

The present invention further provides a method of packaging an SIP integrated circuit, and the method comprises the following steps. First, one or more first block dices produced by a first process are arranged, and one or more second block dices produced by a second process are arranged, wherein at least one of the first process and the second process comprises the usage of the MPCA technique. Then, the first block dices are electrically connected to the second block dices. Thereafter, the first block dices and the second block dices are packaged into a system.

In the method of packaging the SIP integrated circuit according to a preferred embodiment of the present invention, the process device size of the first block dices is smaller than that of the second block dices.

The present invention utilizes a structure of packaging the dices produced by a first process and the dices produced by a second process into a system, thereby reducing the amount of the masks and the cost, raising the yield, reducing the production time, and enhancing the flexibility of the circuit design.

In order to make the aforementioned and other objects, features and advantages of the present invention comprehensible, preferred embodiments accompanied with figures are described in detail below.

DESCRIPTION OF EMBODIMENTS

The present invention provides an SIP integrated circuit and a packaging method thereof. The integrated circuit of the present invention comprises a digital-centric portion and an analog-centric portion, such that the digital-centric portion can be implemented by a process of small process device size together with the usage of the MPCA technique, and the analog-centric portion can be implemented by an ordinary process of large process device size. Therefore, the process device size of the digital-centric portion can be achieved by, for example, an advanced process of less than 90 nm, and the process device size of the analog-centric portion can be achieved by, for example, an original process of more than 180 nm. Moreover, if the MPCA technique is used in the digital-centric portion, when it is intended to alter the design, only the layout of several layers on the integrated circuit is required to be changed without changing the layout of the other layers on the integrated circuit, thus significantly reducing the cost.

Figure 1:
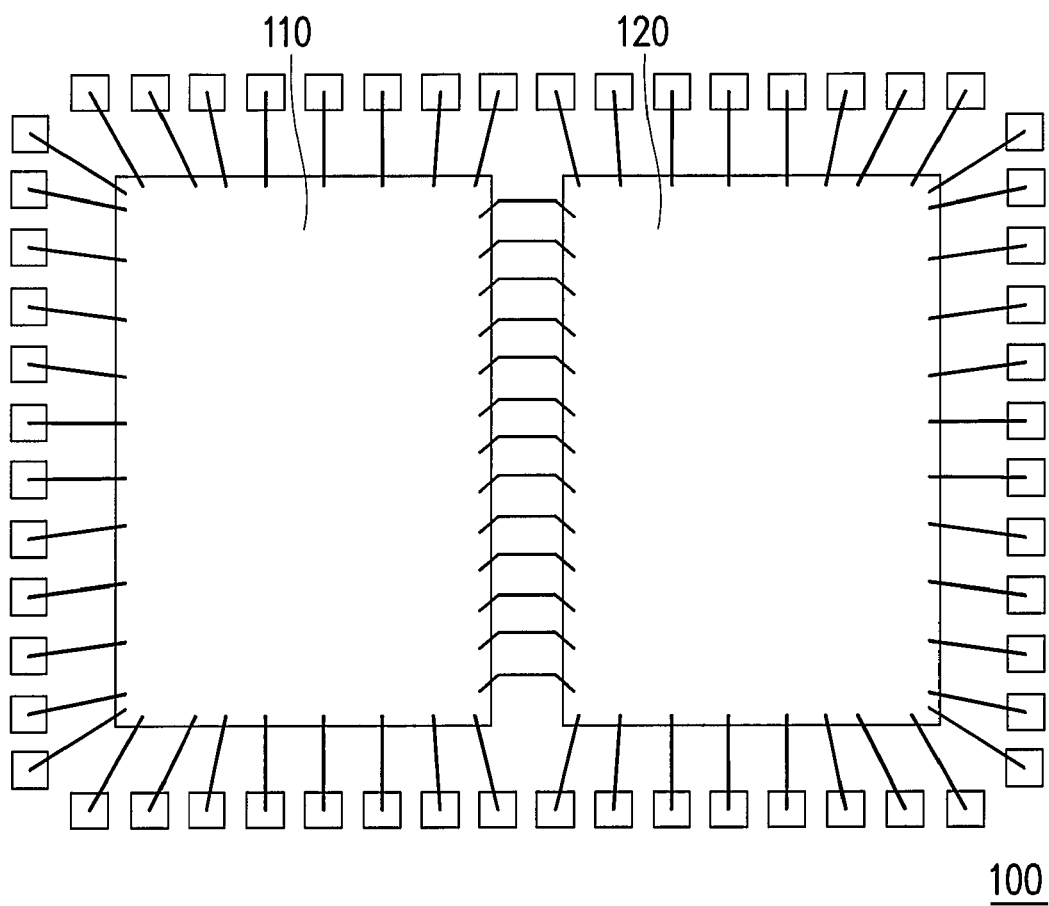
FIG. 1 is a circuit block diagram of an SIP integrated circuit 100 according to an embodiment of the present invention.

FIG. 1 is a circuit block diagram of an SIP integrated circuit 100 according to an embodiment of the present invention. The integrated circuit 100 comprises a first block dice 110 and a second block dice 120. The first block dice 110 utilizes a first process, for example, a process of 90 nm and the usage of the MPCA technique. The second block dice 120 utilizes a second process, for example, a process with the process device size of 180 nm. The first block dice 110 is electrically connected to the second block dice 120, and the first block dice 110 and the second block dice 120 are packaged into a SIP integrated circuit 100. It is apparent to those skilled in the art that the present invention is not limited to be implemented by a combination of the process of 90 nm and the process of 180 nm, and can be implemented by a combination of a process of 65 nm and a process of 130 nm as required, or by other combinations.

Figure 2:
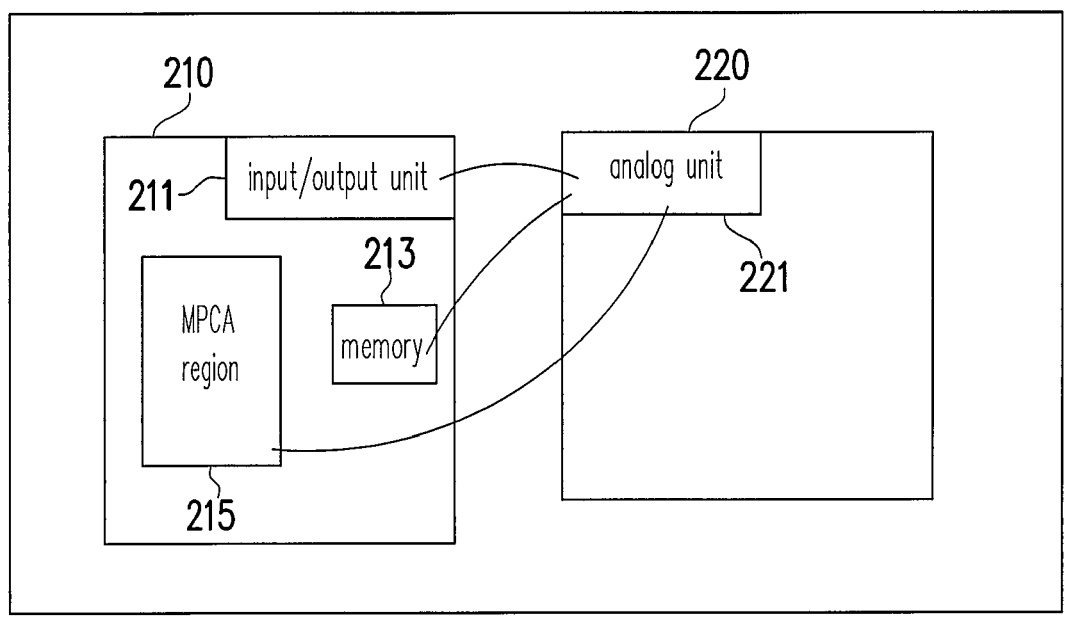
FIG. 2 is a circuit connection diagram of an SIP integrated circuit 200 according to another embodiment of the present invention.

FIG. 2 is a circuit connection diagram of an SIP integrated circuit 200 according to another embodiment of the present invention. The first block dice 210 comprises an input/output unit 211, a memory 213, and an MPCA region 215. The second block dice 220 comprises an analog unit 221 electrically connected to the input/output unit 211, a memory unit 213, and an MPCA region 215. The first block 210 mainly has a digital processing function, and can be additionally provided with functions such as a digital phase-locked loop as required. The second block 220 mainly has an analog processing function. The process device size of the first block dice 210 is 90 nm, and the process device size of the second block dice 220 is 180 nm, and thus the process device size of the first block dice 210 is smaller than that of the second block dices 220. In order to enhance the flexibility of design, the second block dice further comprises a field programmable gate array (FPGA). The first block having the MPCA region 215 according to an embodiment of the present invention is used to reduce the non-recurring engineering (NRE) cost, thereby redesigning or altering the design of the current circuit. In addition, it is apparent to those skilled in the art that the present invention is not limited to utilize the MPCA region together with the input/output unit and the memory to execute the digital-centric function, but can also utilize the MPCA region together with other units, or the entire block can designed by the MPCA.

Figure 3:
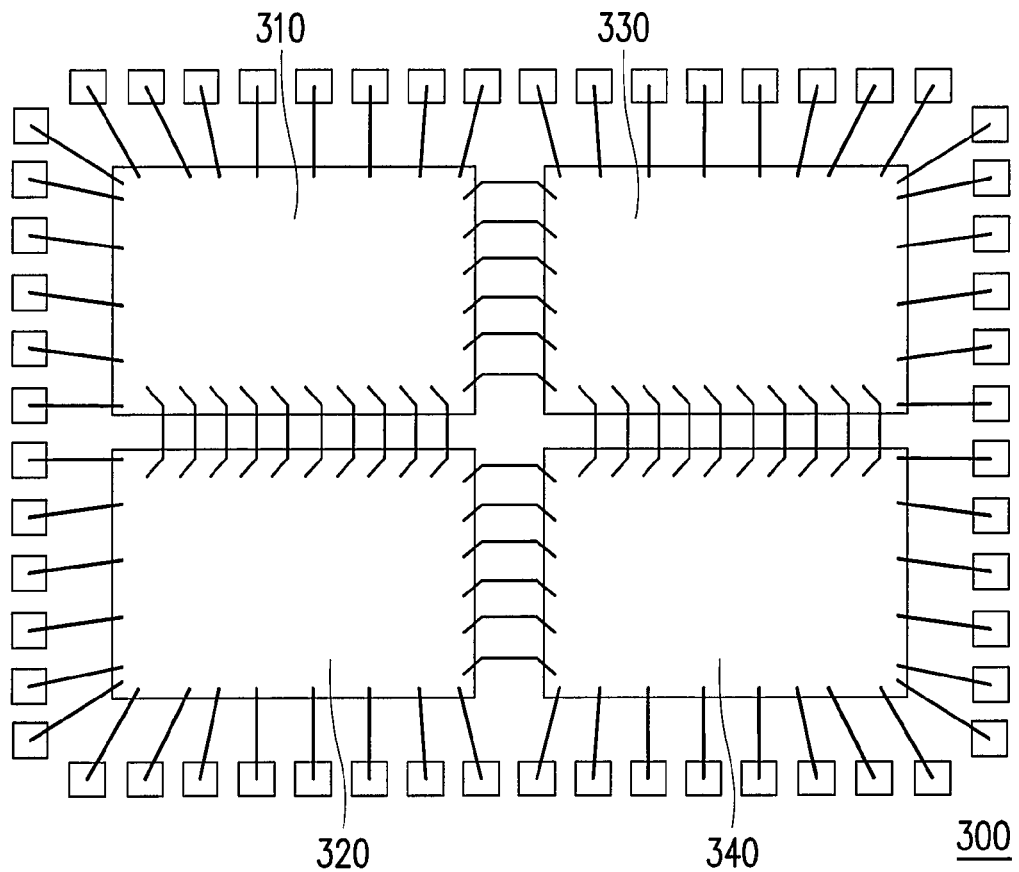
FIG. 3 is a circuit block diagram of an SIP integrated circuit 300 according to still another embodiment of the present invention.

FIG. 3 is a circuit block diagram of another SIP integrated circuit 300 according to still another embodiment of the present invention. The difference between the integrated circuit 300 of FIG. 3 and the integrated circuit 200 of FIG. 2 is the different number of dices. The SIP integrated circuit 300 in FIG. 3 comprises first block dices 310, 320 and second block dices 330, 340. The first block dices 310, 320 each comprise a digital unit (not shown), and mainly have the digital processing function, and the second block dices 330, 340 comprise an analog unit (not shown), and mainly have the analog processing function. The first block dices 310, 320 are electrically connected to the second block dices 330, 340 so as to combine the digital function and the analog function together. The first block dices 310, 320 and the second block dices 330, 340 are packaged into the SIP integrated circuit 300. The MPCA technique can be used to enhance the flexibility of the design of the first block dices 310, 320. The FPGA technique can be used to enhance the flexibility of the design of the second block dices 330, 340. The process device size (e.g., 180 nm) of the first block dices 310, 320 is smaller than process device size (e.g., 90 nm) of the second block dices 330, 340.

It is apparent to those skilled in the art that the number of the first block dice in the embodiment of the present invention is not limited to one or two, but can be a plurality of first block dices with the digital processing function. The number of the second block in the embodiment of the present invention is not limited to be one or two, but the second block can be a plurality of second block dices with the analog processing function. The first block dices and the second block dices mainly function as digital processing, but are not limited to full digital dices or full analog dices. As required, a small part of analog unit or digital-to-analog converter can be arranged in the first block dices, and a small part of digital unit or digital-to-analog converter can be arranged in the second block dices.

Figure 4:
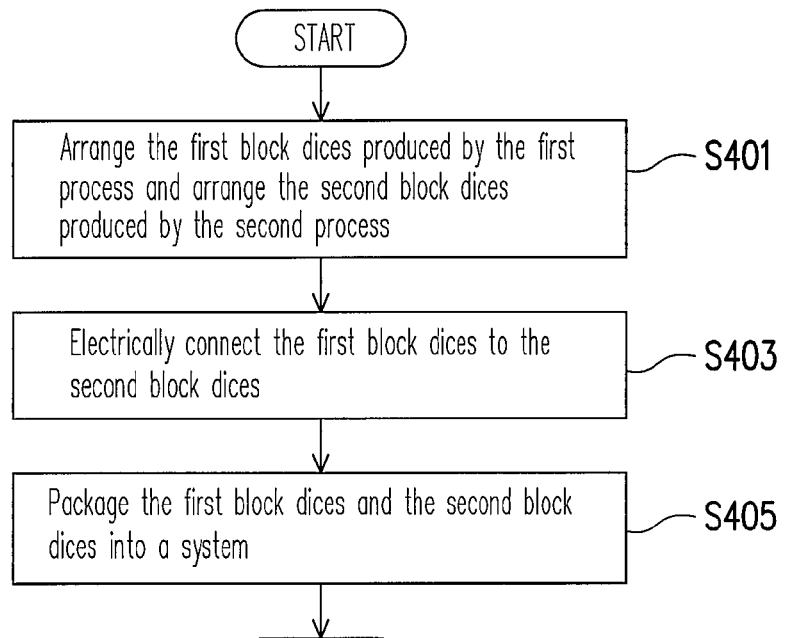
FIG. 4 is a flow chart of a method of packaging an SIP integrated circuit according to an embodiment of the present invention.

FIG. 4 is a flow chart of a method of packaging an SIP integrated circuit according to an embodiment of the present invention. A method of packaging an SIP integrated circuit comprises the following steps. First, one or more first block dices produced by a first process are arranged in step S401, which are portions of a main function of digital processing, and one or more second block dices produced by a second process are also arranged, which are portions of a main function of analog processing. At least one of the first process and the second process comprises the usage of the MPCA technique. The first process comprises the usage of the MPCA technique, and the second process comprises the usage of the FPGA technique for enhancing the flexibility of design. Then, in step S403, the first block dices are electrically connected to the second block dices for combining the digital function and the analog function. Thereafter, in step S405, the first block dices and the second block dices are packaged into a system. In the present embodiment, the first block dices comprise a digital unit, a second block dices comprise an analog unit, wherein the process device size (e.g., 90 nm) of the first block dices is smaller than that (e.g., 180nm) of the second block dices.

According to the SIP integrated circuit and the packaging method thereof of the present invention, the integrated circuit is divided into two parts, wherein the digital-centric portion is implemented by the first block dices produced by a first process using, for example, the MPCA technique. The analog-centric portion is implemented by the second block dices produced by a process with a larger process device size. With this design, the digital part will not be limited by the development of the process for the analog portion, such that the disadvantage that the entire chip of the system on a chip (SOC) must be integrally manufactured can be overcome. On the part of the analog-centric portion, if it is forced to apply an advanced process corresponding to the analog portion, the production yield will become low. In the SOC, if changing the design, the layout of several tens of layers of the integrated circuit must be re-designed. The MPCA only requires changing several layers on top of the integrated circuit, thereby reducing the NRE cost, significantly reducing the cost, and reducing the time from production to market.

To sum up, according to the SIP integrated circuit and packaging method thereof of the present invention, a structure, which is formed by electrically connecting the first and second block dices produced by different processes and then packaging the first and second block dices together, is utilized, thereby reducing the amount of the masks and the NRE cost, raising the yield, reducing the production time, and enhancing the flexibility of the circuit design.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of packaging an SIP integrated circuit, comprising:

arranging one or more first block dices produced by a first process and arranging one or more second block dices produced by a second process, wherein one of the first process and the second process comprises the usage of a metal programmable cell array, and the other one of the first process and the second process comprises the usage of a field programmable gate array;

electrically connecting the first block dices to the second block dices; and packaging the first block dices and the second block dices into a system.

2. A method of packaging an SIP integrated circuit, comprising:

arranging one or more first block dices produced by a first process and arranging one or more second block dices produced by a second process, wherein one of the first process and the second process comprises the usage of a metal programmable cell array electrically connecting the first block dices to the second block dices with connections which comprise at least a direct die-to-die connection; and packaging the first block dices and the second block dices into a system.

3. The method of packaging the SIP integrated circuit as claimed in claim 1, wherein a process device size of the first block dices is smaller than that of the second block dices.

4. The method of packaging the SIP integrated circuit as claimed in claim 3, wherein the process device size of the first block dices is 90 nm, and the process device size of the second block dices is 180 nm.

5. The method of packaging the SIP integrated circuit as claimed in claim 1, wherein the first block dices respectively comprise a digital unit.

6. The method of packaging the SIP integrated circuit as claimed in claim 1, wherein the second block dices respectively comprise an analog unit.

7. The method of packaging the SIP integrated circuit as claimed in claim 2, wherein a process device size of the first block dices is smaller than that of the second block dices.

8. The method of packaging the SIP integrated circuit as claimed in claim 7, wherein the process device size of the first block dices is 90 nm, and the process device size of the second block dices is 180 nm.

9. The method of packaging the SIP integrated circuit as claimed in claim 2, wherein the first block dices respectively comprise a digital unit.

10. The method of packaging the SIP integrated circuit as claimed in claim 2, wherein the second block dices respectively comprise an analog unit.

* * * * *